(12) United States Patent
Maki

(10) Patent No.: US 10,734,365 B2
(45) Date of Patent: Aug. 4, 2020

(54) LIGHT-EMITTING DEVICE

(71) Applicant: Toshiba Hokuto Electronics Corporation, Asahikawa-Shi (JP)

(72) Inventor: Keiichi Maki, Asahikawa (JP)

(73) Assignee: Toshiba Hokuto Electronics Corporation, Asahikawa-Shi (JP)

( * ) Notice: Subject to any disclaimer, the term of this patent is extended or adjusted under 35 U.S.C. 154(b) by 0 days.

(21) Appl. No.: 16/577,499

(22) Filed: Sep. 20, 2019

(65) Prior Publication Data
US 2020/0013763 A1 Jan. 9, 2020

Related U.S. Application Data

(63) Continuation of application No. 15/077,143, filed on Mar. 22, 2016, now Pat. No. 10,461,063, which is a (Continued)

(30) Foreign Application Priority Data

Dec. 2, 2013 (JP) .................................. 2013-249455

(51) Int. Cl.
*H01L 25/075* (2006.01)
*H01L 23/31* (2006.01)
(Continued)

(52) U.S. Cl.
CPC ...... *H01L 25/0753* (2013.01); *H01L 23/3121* (2013.01); *H01L 23/5386* (2013.01);
(Continued)

(58) Field of Classification Search
CPC ..... H01L 25/0753; H01L 33/56; H01L 33/62; H01L 23/3121; H01L 23/5387;
(Continued)

(56) References Cited

U.S. PATENT DOCUMENTS 4,640,581 A * 2/1987 Nakanowatari ..... G02F 1/13452
349/149
5,311,341 A * 5/1994 Hirai .................... G02F 1/13452
257/E23.065
(Continued)

FOREIGN PATENT DOCUMENTS

JP S60-262430 A 12/1985
JP S61-006833 A 1/1986
(Continued)

OTHER PUBLICATIONS

International Search Report and Written Opinion (Application No. PCT/JP2014/005998) dated Jan. 20, 2015, 7 pages.
(Continued)

*Primary Examiner* — Zandra V Smith
*Assistant Examiner* — Jeremy J Joy
(74) *Attorney, Agent, or Firm* — Burr & Brown, PLLC

(57) ABSTRACT

A light-emitting device according to an embodiment includes a light-emitting part and an external wiring. The light-emitting part includes: a pair of insulating substrates that has light transmissive property and flexibility; a plurality of light-emitting elements arranged between the pair of insulating substrates; an internal wiring pattern that is provided between the pair of insulating substrates, and is connected to the light-emitting elements; and a resin layer that has light transmissive property and insulating property, and is provided between the pair of insulating substrates. An end of the external wiring is divided into a plurality of wirings having a line width that is narrower than a line width of the internal wiring pattern. An end of the internal wiring pattern is bonded, at an end of the insulating substrates, to the end of the external wiring that is divided into a plurality of wirings by an anisotropic conductive adhesive.

8 Claims, 7 Drawing Sheets

US 10,734,365 B2
Page 2

Related U.S. Application Data continuation of application No. PCT/JP2014/005998, filed on Dec. 1, 2014.

(51) Int. Cl.

| | |
|---|---|
| *H01L 23/538* | (2006.01) |
| *H05K 1/02* | (2006.01) |
| *H01L 33/42* | (2010.01) |
| *H01L 33/56* | (2010.01) |
| *H01L 33/62* | (2010.01) |
| *H05K 1/18* | (2006.01) |
| *H05K 3/32* | (2006.01) |
| *H05K 3/36* | (2006.01) |

(52) U.S. Cl.
CPC .......... *H01L 23/5387* (2013.01); *H01L 33/42* (2013.01); *H01L 33/56* (2013.01); *H01L 33/62* (2013.01); *H05K 1/028* (2013.01); *H05K 1/185* (2013.01); *H05K 3/323* (2013.01); *H05K 3/361* (2013.01); *H01L 2224/16225* (2013.01); *H01L 2933/0066* (2013.01); *H05K 1/0281* (2013.01); *H05K 2201/0108* (2013.01); *H05K 2201/09236* (2013.01); *H05K 2201/10106* (2013.01); *H05K 2201/10128* (2013.01); *H05K 2201/10189* (2013.01); *H05K 2201/10325* (2013.01)

(58) Field of Classification Search
CPC ... H01L 23/5386; H01L 27/3276–3279; G02F 1/13452; H05K 3/361; H05K 3/323; H05K 1/189; H05K 1/028
See application file for complete search history.

(56) References Cited

U.S. PATENT DOCUMENTS

| | | | | |
|---|---|---|---|---|
| 5,528,403 | A * | 6/1996 | Kawaguchi | G02F 1/13452 |
| | | | | 349/149 |
| 5,822,030 | A * | 10/1998 | Uchiyama | G02F 1/13452 |
| | | | | 349/149 |
| 5,936,850 | A * | 8/1999 | Takahashi | G02F 1/13452 |
| | | | | 361/784 |
| 6,087,680 | A * | 7/2000 | Gramann | H01L 25/0753 |
| | | | | 257/91 |
| 6,172,730 | B1 * | 1/2001 | Fujita | G02F 1/13452 |
| | | | | 349/138 |
| 6,265,770 | B1 * | 7/2001 | Uchiyama | G02F 1/13452 |
| | | | | 257/698 |
| 6,437,846 | B1 * | 8/2002 | Ono | G02F 1/133305 |
| | | | | 349/113 |
| 6,518,557 | B1 | 2/2003 | Izumi et al. | |
| 6,601,947 | B1 * | 8/2003 | Sato | G02F 1/13452 |
| | | | | 347/68 |
| 7,952,107 | B2 | 5/2011 | Daniels et al. | |
| 8,044,415 | B2 | 10/2011 | Messere et al. | |
| 9,511,707 | B2 | 12/2016 | Nakamura | |
| 10,056,438 | B2 * | 8/2018 | Miyamoto | H01L 51/0097 |
| 2002/0024302 | A1 * | 2/2002 | Wu | H01J 11/12 |
| | | | | 313/582 |
| 2002/0135727 | A1 | 9/2002 | Nakaminami et al. | |
| 2003/0015960 | A1 * | 1/2003 | Seo | H01L 51/5012 |
| | | | | 313/504 |
| 2004/0108132 | A1 * | 6/2004 | Ohazama | H05K 3/323 |
| | | | | 174/257 |
| 2007/0268441 | A1 * | 11/2007 | Liu | G02F 1/13452 |
| | | | | 349/149 |
| 2008/0117376 | A1 * | 5/2008 | Takenaka | H05K 1/028 |
| | | | | 349/152 |
| 2008/0151167 | A1 * | 6/2008 | Aota | G02F 1/134363 |
| | | | | 349/139 |
| 2008/0242181 | A1 * | 10/2008 | Takahashi | G02F 1/1345 |
| | | | | 445/24 |
| 2009/0058285 | A1 | 3/2009 | Yamazaki et al. | |
| 2009/0114928 | A1 * | 5/2009 | Messere | B32B 17/10559 |
| | | | | 257/88 |
| 2010/0277448 | A1 | 11/2010 | Okamoto et al. | |
| 2014/0085281 | A1 | 3/2014 | Lim | |
| 2014/0233249 | A1 | 8/2014 | Lee | |
| 2014/0300270 | A1 * | 10/2014 | Sakamoto | H05B 33/10 |
| | | | | 315/51 |
| 2014/0362565 | A1 * | 12/2014 | Yao | H01L 25/0753 |
| | | | | 362/223 |
| 2015/0230331 | A1 | 8/2015 | Lee | |
| 2015/0249069 | A1 * | 9/2015 | Yoshida | H01L 33/62 |
| | | | | 257/89 |
| 2016/0020355 | A1 | 1/2016 | Aoyama et al. | |
| 2016/0144402 | A1 | 5/2016 | Kandori | |
| 2018/0217640 | A1 * | 8/2018 | Nishikawa | G06F 1/1637 |

FOREIGN PATENT DOCUMENTS

| | | |
|---|---|---|
| JP | 61-194796 A1 | 8/1986 |
| JP | S61-194732 A | 8/1986 |
| JP | H10-321365 A1 | 12/1998 |
| JP | H11-145381 A | 5/1999 |
| JP | H11-177147 A | 7/1999 |
| JP | 11-340285 A1 | 12/1999 |
| JP | 2000-227952 A | 8/2000 |
| JP | 2000-299411 A | 10/2000 |
| JP | 2002-246418 A | 8/2002 |
| JP | 2009-010204 A1 | 1/2009 |
| JP | 2011-134926 A1 | 7/2011 |
| JP | 2012-084855 A | 4/2012 |
| JP | 5533183 B2 | 6/2014 |
| WO | 2005/099310 A2 | 10/2005 |

OTHER PUBLICATIONS

Supplementary European Search Report from a corresponding European patent application dated Mar. 9, 2018, 8 pages.
European Office Action (Application No. 14867611.7) dated Mar. 11, 2020.

\* cited by examiner

LIGHT-EMITTING DEVICE

CROSS REFERENCE TO RELATED APPLICATIONS

This application is continuation of U.S. application Ser. No. 15/077,143, filed Mar. 22, 2016, which is a continuation of International Application No. PCT/JP2014/005998, filed on Dec. 1, 2014, which is based upon and claims the benefit of priority from the prior Japanese Patent Application No. 2013-249455, filed on Dec. 2, 2013; the entire contents of which are incorporated herein by reference.

FIELD OF THE INVENTION

Embodiments described herein relate generally to a light-emitting device including a light-emitting element embedded in an insulating body that has light transmissive property and flexibility.

BACKGROUND OF THE INVENTION

Light-emitting devices using a light-emitting diode (LED) are widely used in optical devices such as display devices, display lamps, various switches, signal devices, and general illumination equipment for indoor use, outdoor use, stationary use, mobile use, and the like.

In a known example of such a light-emitting device, the light-emitting device is formed by sandwiching a plurality of LED elements between a pair of light transmissive and flexible insulating substrates and filling a light transmissive resin between the insulating substrates so as to embed the plurality of LED elements in a transparent resin.

In such a light-emitting device, electrical wiring for lighting the LED elements is also embedded together with the LED elements within the transparent resin. Therefore, the electrical wiring to be embedded also needs to be transparent and flexible. Thus, as the electrical wiring, for example, a mesh wiring formed by fine wires made of a material with relatively high conductivity such as silver, or transparent wiring formed by processing ITO (Indium Tin Oxide) film is used.

In order to operate such a light-emitting device, the electrical wiring must be electrically connected to an external power source or some other external devices (hereinafter referred to as an "external device, etc."). However, the electrical wiring that has been embedded in the transparent resin is extremely thin, and thus it is difficult to directly connect an external device, etc. to such thin electrical wiring.

DETAILED DESCRIPTION OF THE INVENTION

A light-emitting device according to an embodiment is a flexible light-emitting device having flexibility, including: a light-emitting part; and an external wiring connected to the light-emitting part. The light-emitting part includes: a pair of insulating substrates that has light transmissive property and flexibility; a plurality of light-emitting elements arranged between the pair of insulating substrates; an internal wiring pattern that is formed on an inside surface of at least one of the pair of insulating substrates, and is connected to the light-emitting elements; and a resin layer that has light transmissive property and insulating property, and is provided between the pair of insulating substrates. An end of the external wiring is divided into a plurality of wirings having a line width that is narrower than a line width of the internal wiring pattern. An end of the internal wiring pattern is bonded, at an end of the insulating substrates, to the end of the external wiring that is divided into a plurality of wirings by an anisotropic conductive adhesive.

A resin-embedded light-emitting device (hereinafter abbreviated to "light-emitting device") according to embodiments of the present invention will be explained below.

Figure 1A:
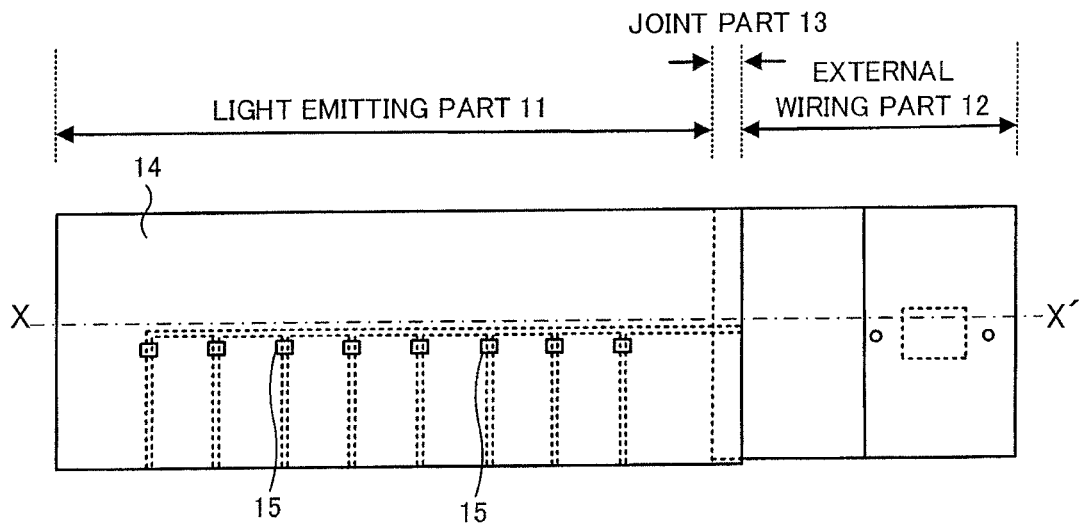
FIG. 1A is a schematic top view illustrating a rough configuration of a light-emitting device according to an embodiment.
Figure 1B:
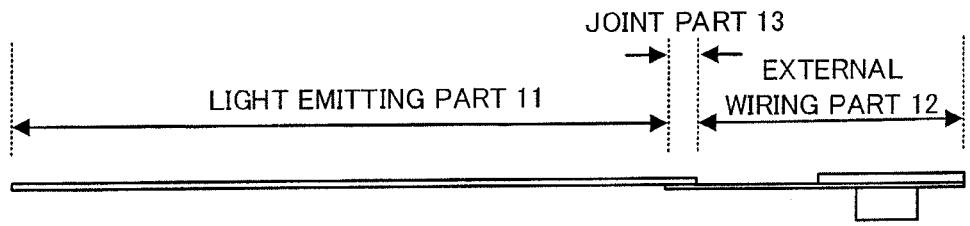
FIG. 1B is a schematic side view illustrating a rough configuration of the light-emitting device according to the embodiment.
Figure 2:
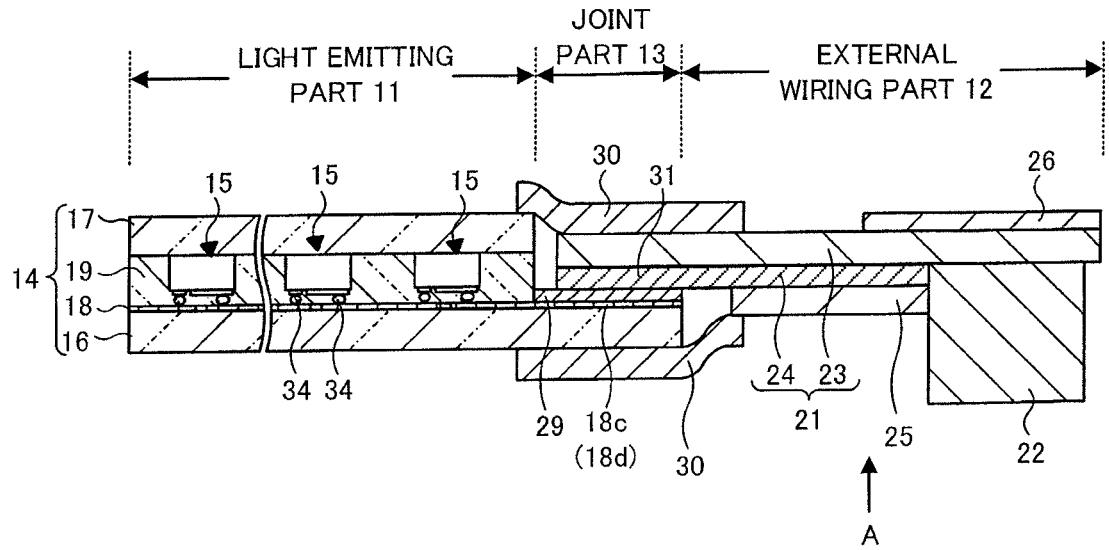
FIG. 2 is a cross-section view of the light-emitting device along a dot-dash line X-X' shown in FIG. 1A.

FIG. 1A is a schematic top view illustrating a rough configuration of a light-emitting device according to an embodiment of the present invention. FIG. 1B is a side view illustrating a rough configuration of the light-emitting device according to the embodiment of the present invention. FIG. 2 is a cross-section view of the light-emitting device along a dot-dash line X-X' shown in FIG. 1A.

As shown in FIG. 1A and FIG. 1B, a light-emitting device 10 includes a light-emitting part 11 which has, for example, a plurality of light-emitting diode elements 15 (hereinafter referred to as "LED elements 15") as a plurality of light-emitting elements, an external wiring part 12 that electrically connects the light-emitting part 11 with a power source and other external devices (hereinafter referred to as "external devices, etc.") (not illustrated), and a joint part 13 that electrically connects the light-emitting part 11 and the external wiring part 12 between the light-emitting part 11 and the external wiring part 12.

In the light-emitting part 11, as shown in FIG. 1A, for example, eight LED elements 15 are disposed at predetermined intervals in a light transmissive insulating sheet 14. As shown in FIG. 2, the light transmissive insulating sheet 14 has a first light transmissive insulating substrate 16 and a second light transmissive insulating substrate 17 in the light-emitting part 11. The eight LED elements 15 are arranged between the first light transmissive insulating substrate 16 and the second light transmissive insulating substrate 17. A light transmissive internal wiring pattern 18 connected to the LED elements 15 is deposited and formed on an inner surface of at least one of the pair of light transmissive insulating substrates 16 and 17, for example the first light transmissive insulating substrate 16, or in other words on a surface on the side opposing the second light transmissive insulating substrate 17. A thermoplastic insulative light transmissive resin layer 19 is also filled between the pair of light transmissive insulating substrates 16 and 17. The eight LED elements 15 and the internal wiring pattern 18 connected thereto are embedded between the pair of insulating substrates 16 and 17 by the light transmissive resin layer 19.

The first light transmissive insulating substrate 16 and the second light transmissive insulating substrate 17 are both formed by a sheet-shaped resin material that has insulating property, light transmissive property and flexibility. As such a sheet-shaped resin material, for example, polyethylene terephthalate (PET), polyethylene naphthalate (PEN), polycarbonate (PC), polyethylene succinate (PES), an annular olefin resin (such as Arton (product name) from JSR), acrylic resin, and the like can be used. The light transmittance of the substrates 16 and 17 is 90% or more, and preferably 95% or more. The substrates 16 and 17 preferably have a thickness in the range from 50 to 300 μm from the viewpoint of the flexibility and light transmissive property of the substrates 16 and 17.

Figure 3A:
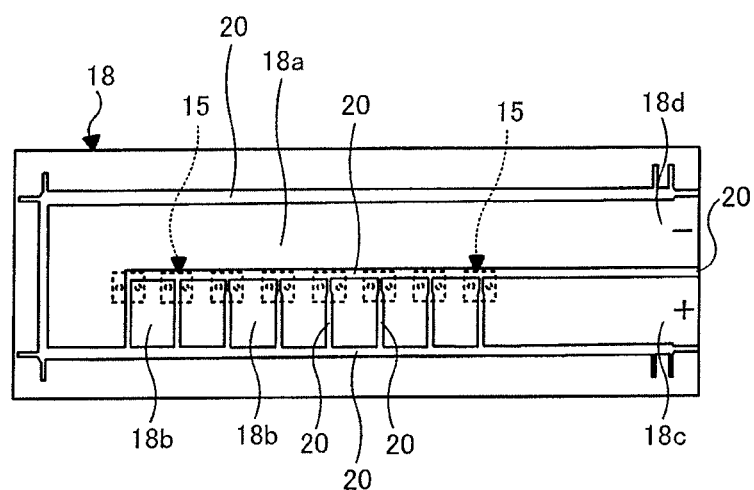
FIG. 3A is a plan view schematically illustrating an example of an internal wiring pattern.

Next, as shown in FIG. 3A, the internal wiring pattern 18 provided on the surface of the first light transmissive insulating substrate 16 is formed by patterning an ITO coating, which is formed by depositing, for example, indium tin oxide, on, for example, the entire surface of the first light transmissive insulating substrate 16. This patterning is carried out by forming linear insulating regions 20 of a very small width on an ITO film by partially removing, using laser processing, an etching treatment, or the like, the ITO film formed by deposition to expose the underlying first light transmissive insulating substrate 16. In other words, the internal wiring pattern 18 is constituted by a linear internal wiring pattern 18a of a wide line width, a plurality of fine wiring pieces 18b that are arranged linearly and peripherally surrounded by the insulating regions 20, and first and second internal wiring ends 18c and 18d. The plurality of LED elements 15 are serially connected overall to the first and second internal wiring ends 18c and 18d by connecting positive and negative electrodes between the plurality of adjacent fine wiring pieces 18b.

ITO wiring has high electrical resistance compared to metal wiring materials such as copper or aluminum. Therefore, in the case that the internal wiring pattern 18 is ITO wiring as described above, the light transmissive property of the ITO wiring can be maintained and the electrical resistance of the ITO wiring can be reduced by widening the line width of the wiring.

As the transparent conductive material that constitutes the internal wiring pattern, in addition to ITO, fluorine-doped tin oxide (FTO), zinc oxide, indium zinc oxide (IZO), and the like can be used.

Figure 3B:
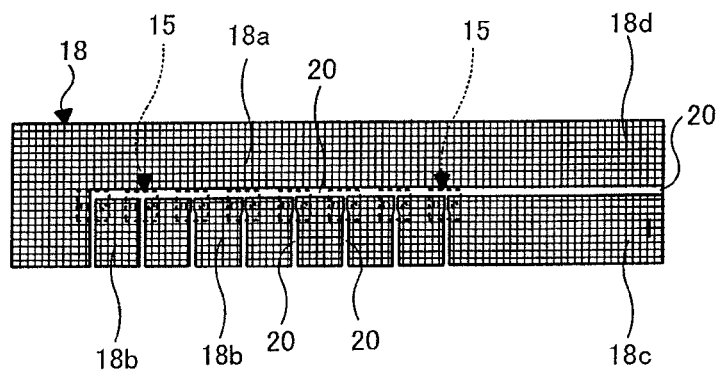
FIG. 3B is a plan view schematically illustrating another example of an internal wiring pattern.

As shown in FIG. 3B, the internal wiring pattern 18 can also be formed by patterning a meshed metallic fine wire constituted by Ag or the like on the entire surface of the first light transmissive insulating substrate 16. This patterning is carried out by partially cutting away the meshed metallic fine wire using laser processing, an etching treatment, or the like. Since the metallic wiring material such as Ag does not have light transmissive property, the light transmissive property of the meshed metallic fine wire can be maintained by thinning the wire and meshing it. Since this this kind of meshed wiring uses a metallic wiring material with low resistance such as Ag, the electrical resistance can be kept sufficiently low even if the wire is thinned. In FIG. 3B, similar to FIG. 3A, the meshed internal wiring pattern 18 having a wide line width can be formed by forming the linear insulating regions 20 of a very small width when patterning the meshed metallic fine wire. In the meshed internal wiring pattern 18 as well, the electrical resistance of the wiring can be further reduced by widening the line width of the internal wiring pattern 18. In FIG. 3B, portions corresponding to FIG. 3A are illustrated with the same reference signs, and detailed explanations thereof are omitted. The internal wiring pattern 18 shown in FIG. 3B is formed overall by a meshed metallic fine wire, but light transmissive property is not necessarily required at the first and second internal wiring ends 18c and 18d. Thus, the first and second internal wiring ends 18c and 18d can be constituted by thick wiring as shown in FIG. 3A, in which the ends are constituted by a metallic wiring material with low resistance such as Ag.

In addition to those described above, the internal wiring pattern 18 shown in FIG. 3A and FIG. 3B can also be a wiring pattern formed by, for example, applying a mixture of fine particles of a transparent conductive material having an average particle diameter in the range from 10 to 300 nm and a transparent resin binder over the entire surface by screen printing or the like, and then partially removing this coating film by subjecting the coating film to laser processing or photolithography to expose the underlying insulating substrate.

Although not illustrated, the internal wiring pattern 18 can also be formed such that the plurality of LED elements 15 are connected in parallel between the first and second internal wiring ends 18c and 18d, or such that the plurality of LED elements 15 are connected by a combination of serially and in parallel.

Next, the external wiring part 12 of the light-emitting device 10 shown in FIG. 1A and FIG. 1B will be explained. The external wiring part 12 is connected to the ends 18c and 18d of the internal wiring pattern 18 of the light-emitting part 11 in the joint part 13. As shown in FIG. 2, the external wiring part 12 is constituted mainly by a flexible printed wiring board 21 and a connector 22.

The flexible printed wiring board 21 has a substrate 23 that is insulative and flexible, and an external wiring 24 provided on the surface of the substrate 23. One end of the external wiring 24 extends together with the substrate 23 to a position opposing the internal wiring ends 18c and 18d of the light-emitting part 11. The other end of the external wiring 24 is inserted into the connector 22 provided on the surface of the substrate 23. This flexible printed wiring board 21 is constituted so as to have higher flexibility than the light-emitting part 11.

Since light transmissive property is not required for the external wiring part 12, for example, polyimide is used for the substrate 23 of the flexible printed wiring board 21. Further, since it is also not necessary to constitute the external wiring 24 by a light transmissive thin film-shaped conductive material such as, for example, ITO, the external wiring 24 is formed by ordinary copper or by a metallic wiring material in which gold is coated onto the surface of copper.

A coverlay film 25 made of polyimide is provided as a protective layer of the external wiring 24 in a partial region on the surface of the flexible printed wiring board 21.

On the surface of the flexible printed wiring board 21, the connector 22 is provided on the substrate 23. The connector 22 is used to electrically connect the external wiring 24 and a connection terminal (not illustrated) of an external device, etc. The connector 22 has a plurality of connection terminals into which connection terminals of external devices, etc. are inserted.

Figure 4:
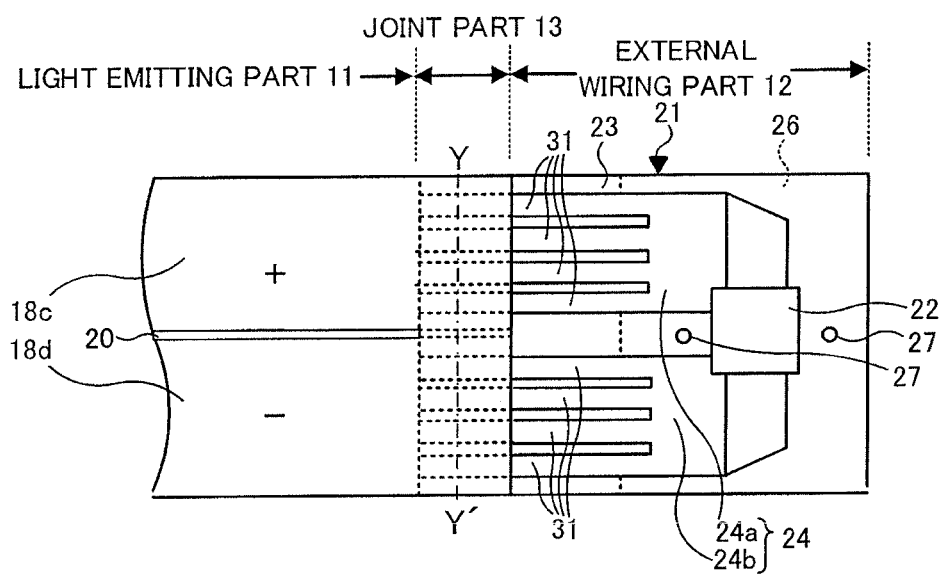
FIG. 4 is an enlarged plan view schematically illustrating an external wiring part and a joint part shown in FIG. 1A.

Further, a reinforcing panel 26 with lower flexibility than the light-emitting part 11 is provided on the underside of the surface of the flexible printed wiring board 21 on which the connector 22 is mounted. The reinforcing panel 26 is provided for facilitating the mounting of the connector 22 and facilitating the fixing of a mounting part of the connector 22 of the flexible printed wiring board 21 to an external device (not illustrated) such as a display device or optical device. Therefore, as shown in FIG. 4, a plurality of fixing holes 27 are provided to the external wiring part 12 so as to penetrate through the substrate 23 and the reinforcing panel 26 of the flexible printed wiring board 21. Also, the connector 22 is fixed via a pad on the surface of the substrate 23 of the flexible printed wiring board 21.

The internal wiring ends 18c and 18d of the light-emitting part 11 and the one end of the external wiring 24 of the flexible printed wiring board 21 explained above are electrically connected by an anisotropic conductive adhesive (ACF) 29 in the joint part 13. As the anisotropic conductive adhesive 29, an adhesive obtained by mixing, for example, Ni of a particle diameter of approximately 2 µm as a conductive material into, for example, a heat-curable adhesive having a film thickness of approximately 25 µm is used.

A protective tape 30 constituted by an insulating material is wound around the outer periphery of the joint part 13. By winding the protective tape 30 around the outer periphery of the joint part 13, the light-emitting part 11 and the external wiring part 12 are more strongly bonded. The light-emitting part 11 and the external wiring part 12 can also be strongly bonded by forming a curable adhesive such as an epoxy resin on the outer periphery of the joint part 13.

Figure 5:
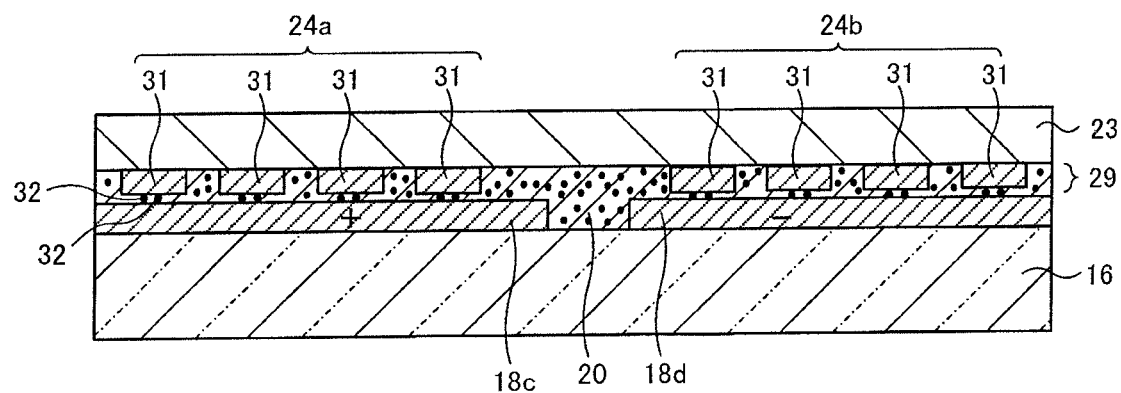
FIG. 5 is a schematic cross-section view of the joint part along a dot-dash line Y-Y' shown in FIG. 4.

FIG. 4 is a schematic plan view of the external wiring part 12 and the joint part 13 when viewed from the direction of the arrow mark A in FIG. 2. FIG. 5 is a cross-section view of the joint part 13 along the dot-dash line Y-Y' shown in FIG. 4. In FIG. 4, the coverlay film 25 serving as the protective layer of the external wiring 24 and the protective tape 30 are omitted. In FIG. 5, the protective tape 30 is omitted. Hereinafter, the external wiring part 12 and the joint part 13 will be explained in further detail referring to FIG. 4 and FIG. 5.

As shown in FIG. 4, in the joint part 13, the internal wiring ends 18c and 18d are formed by patterning an ITO thin film into a wide wiring pattern as explained above. A positive voltage and a negative voltage to be applied to the LED elements 15 are supplied respectively to the internal wiring ends 18c and 18d.

On the other hand, the external wiring 24 of the flexible printed wiring board 21 is constituted by a first external wiring 24a that is connected to the first internal wiring end 18c and a second external wiring 24b that is connected to the second internal wiring end 18d. Excluding the ends which are connected to the connector 22, the external wirings 24a and 24b are divided into a plurality of divided wirings 31 having a line width that is narrower than the line width of the first and second internal wiring ends 18c and 18d. The external wirings 24a and 24b are connected using the anisotropic conductive adhesive 29 to the first and second internal wiring ends 18c and 18d at the end on the light-emitting part 11 side.

In FIG. 4, the first and second external wirings 24a and 24b are each divided into four wirings. However, the first and second external wirings 24a and 24b are actually each constituted by a plurality of the strip-shaped divided wirings 31 having a line width of, for example, 250 µm. In this way, since the external wirings 24a and 24b are divided into a plurality of the divided wirings 31 having a narrow line width, the external wirings 24a and 24b can be imparted with flexibility. The line width of each of the plurality of divided wirings 31 is wider than the diameter of the conductive materials included in the anisotropic conductive adhesive 29.

By dividing the first and second external wirings 24a and 24b into the plurality of divided wirings 31, the contact surface area between the first and second external wirings 24a and 24b and the anisotropic conductive adhesive 29 can be increased. Thus, as will be explained later, the connection between the first and second external wirings 24a and 24b and the first and second internal wiring ends 18c and 18d by the anisotropic conductive adhesive 29 can be secured and the reliability thereof can be increased.

As shown in FIG. 5, the plurality of divided wirings 31 having a line width that is narrower than the line width of the first and second internal wiring ends 18c and 18d are connected by the anisotropic conductive adhesive 29 on the first and second internal wiring ends 18c and 18d. In other words, since the vertical direction interval between the internal wiring ends 18c and 18d and the opposing surfaces of the divided wirings 31 is small, the internal wiring ends 18c and 18d and the divided wirings 31 are electrically connected via conductive materials 32 included in the anisotropic conductive adhesive 29. However, since the horizontal direction interval between the divided wirings 31 themselves or the horizontal direction interval between the internal wiring ends 18c and 18d is wider than the above-mentioned vertical direction interval, conduction via the conductive materials 32 is not established in these intervals. Therefore, the intervals between the divided wirings 31 themselves and between the internal wiring ends 18c and 18d are electrically insulated.

Next, a method for manufacturing the light-emitting device 10 described above will be explained referring to FIGS. 6A and 6B to FIGS. 9A and 9B. FIG. 6A, FIG. 7A, FIG. 8A, and FIG. 9A are cross-section views corresponding to FIG. 2 in which the light-emitting part 11 has been enlarged for explaining the method for manufacturing the light-emitting device 10. FIG. 6B, FIG. 7B, FIG. 8B, and FIG. 9B are cross-section views corresponding to FIG. 5 in which the joint part 13 has been enlarged for explaining the method for manufacturing the light-emitting device 10.

Figure 6A:
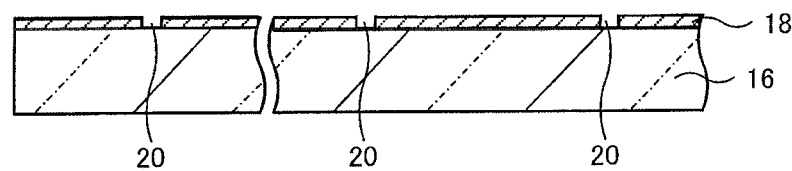
FIG. 6A is a cross-section view corresponding to FIG. 2 and illustrating a light-emitting part for explaining a manufacturing method of the light-emitting device according to the embodiment.
Figure 6B:
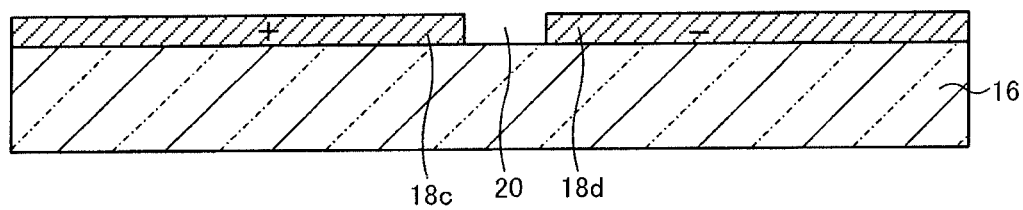
FIG. 6B is a cross-section view corresponding to FIG. 5 and illustrating the joint part for explaining a manufacturing method of the light-emitting device according to the embodiment.

First, as shown in FIG. 6A and FIG. 6B, an ITO film is formed over the entire surface of the first light transmissive insulating substrate 16. A portion of the ITO film is then removed by laser processing to expose the underlying first light transmissive insulating substrate 16, thereby forming the linear insulating regions 20. The internal wiring pattern 18 is formed by dividing the ITO film formed on the entire surface of the first light transmissive insulating substrate 16 with the linear insulating regions 20, or partially surrounding the ITO film with the insulating regions 20. As shown by the example illustrated in FIG. 3A, the internal wiring pattern 18 formed in this way is constituted by the linear internal wiring pattern 18a having a wide line width, the plurality of fine wiring pieces 18b that are arranged linearly, and the first and second internal wiring ends 18c and 18d.

Figure 7A:
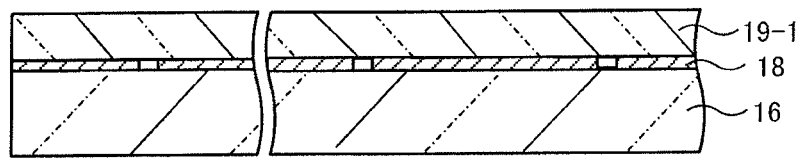
FIG. 7A is a cross-section view corresponding to FIG. 2 and illustrating the light-emitting part for explaining a manufacturing method of the light-emitting device according to the embodiment.
Figure 7B:
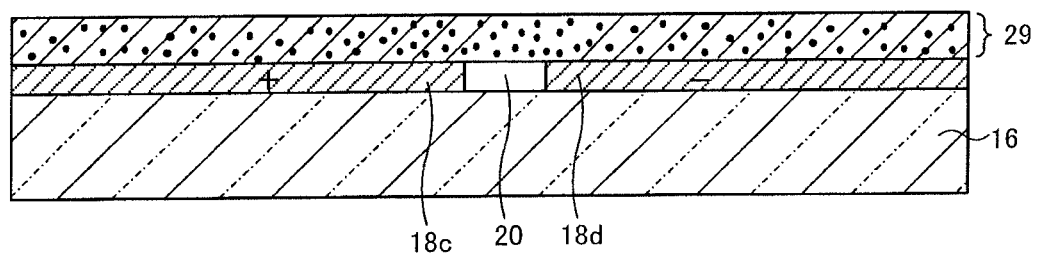
FIG. 7B is a cross-section view corresponding to FIG. 5 and illustrating the joint part for explaining a manufacturing method of the light-emitting device according to the embodiment.

Next, as shown in FIG. 7A, a first thermoplastic light transmissive resin layer 19-1 is formed on the surface of the first light transmissive insulating substrate 16 including the internal wiring pattern 18 within the light-emitting part 11. As shown in FIG. 7B, in the joint part 13, the anisotropic conductive adhesive 29 is formed on the first and second internal wiring ends 18c and 18d of the internal wiring pattern 18. The anisotropic conductive adhesive 29 is preferably formed to be, for example, thinner than the diameter of the conductive materials included in the anisotropic conductive adhesive 29. By forming the anisotropic conductive adhesive 29 to be thin in this way, it becomes easy to interpose the conductive materials 32 between the divided wirings 31 and the first and second internal wiring ends 18c and 18d in the pressing process shown in FIG. 9B explained below.

Figure 8A:
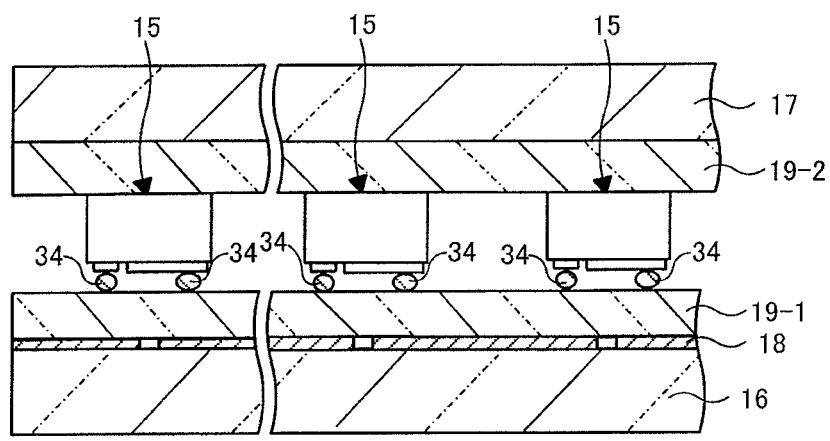
FIG. 8A is a cross-section view corresponding to FIG. 2 and illustrating the light-emitting part for explaining a manufacturing method of the light-emitting device according to the embodiment.

Next, as shown in FIG. 8A, in the light-emitting part 11, the plurality of LED elements 15 are disposed via metal bumps 34 on the surface of the first light transmissive resin layer 19. Subsequently, the second light transmissive insulating substrate 17, in which a second thermoplastic light transmissive resin layer 19-2 is formed on the underside surface thereof, is disposed on the plurality of LED elements 15 so that the light transmissive resin layer 19-2 opposes the first light transmissive resin layer 19-1 on the first light transmissive insulating substrate 16.

Figure 8B:
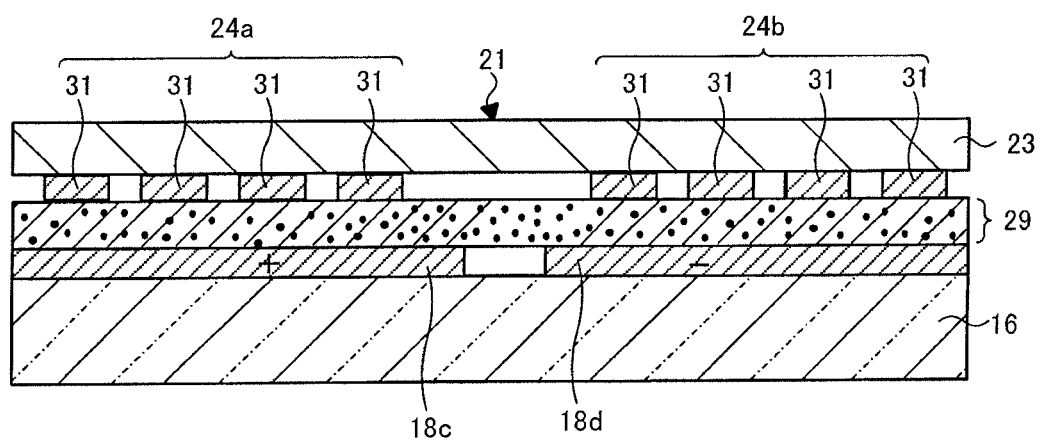
FIG. 8B is a cross-section view corresponding to FIG. 5 and illustrating the joint part for explaining a manufacturing method of the light-emitting device according to the embodiment.

In the joint part 13, as shown in FIG. 8B, the flexible printed wiring board 21 is disposed so that the divided wirings 31 of the first and second external wirings 24a and 24b oppose the anisotropic conductive adhesive 29.

Figure 9A:
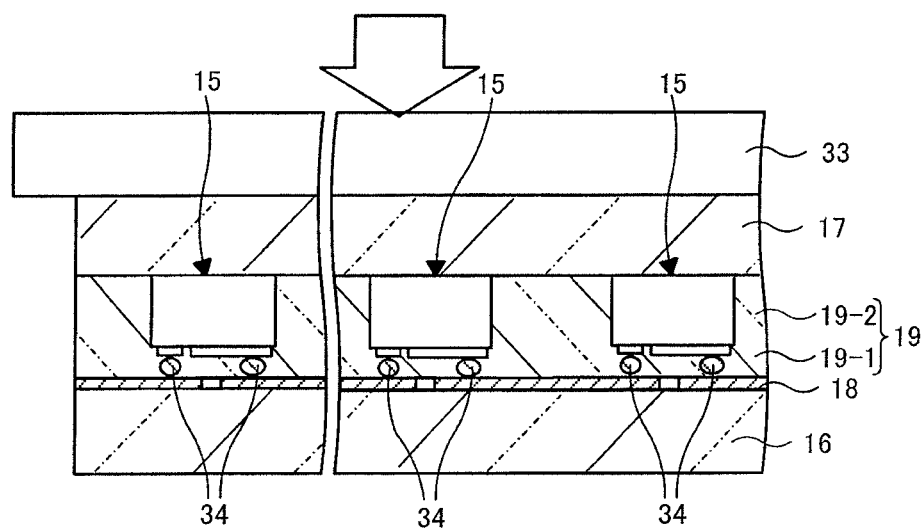
FIG. 9A is a cross-section view corresponding to FIG. 2 and illustrating the light-emitting part for explaining a manufacturing method of the light-emitting device according to the embodiment.
Figure 9B:
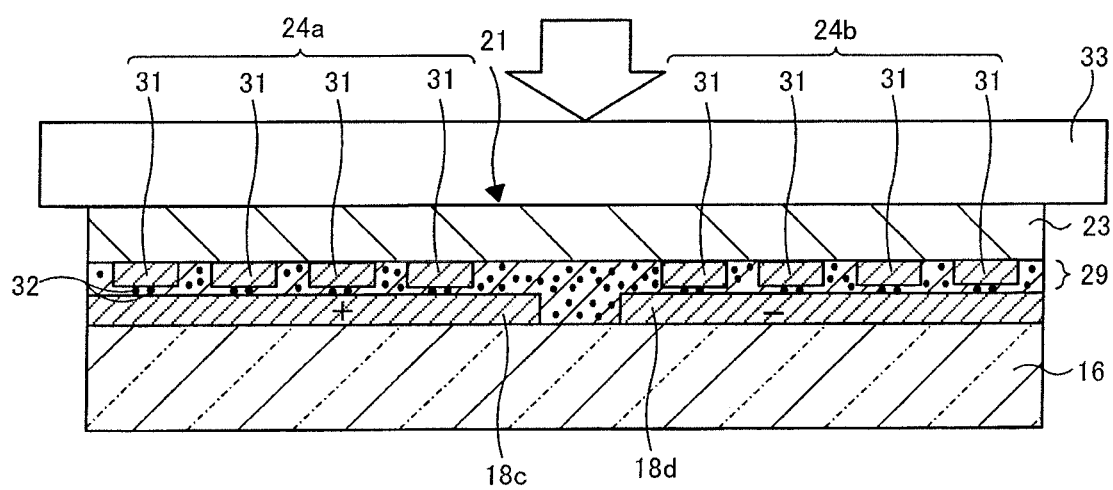
FIG. 9B is a cross-section view corresponding to FIG. 5 and illustrating the joint part for explaining a manufacturing method of the light-emitting device according to the embodiment.

Next, as shown in FIG. 9A and FIG. 9B, the second light transmissive insulating substrate 17 and the flexible printed wiring board 21 are pressed using a thermocompression head 33 under conditions of, for example, 165° C. and 2 MPa. As a result, in the light-emitting part 11, as shown in FIG. 9A, the LED elements 15 descend until the metal bumps 34 provided on the electrodes of the LED elements 15 contact the internal wiring pattern 18 on the first light transmissive insulating substrate 16. The first light transmissive resin layer 19-1 formed on the first light transmissive insulating substrate 16 and the second light transmissive resin layer 19-2 formed on the second light transmissive insulating substrate 17 are mixed and integrated with each other, and thus are filled as the light transmissive resin layer 19 between the first and second light transmissive insulating substrates 16 and 17 and between the LED elements 15.

In the external wiring part 12, as shown in FIG. 9B, when the flexible printed wiring board 21 is pressed, the divided wirings 31 that constitute the first and second external wirings 24a and 24b are embedded in the anisotropic conductive adhesive 29. The divided wirings 31 contact the first and second internal wiring ends 18c and 18d via the conductive materials 32 included in the anisotropic conductive adhesive 29. Therefore, the divided wirings 31 are in electrical conduction with the first and second internal wiring ends 18c and 18d. Further, the first light transmissive insulating substrate 16 extending from the light-emitting part 11 and the flexible printed wiring board 21 extending from the external wiring part 12 are fixed to each other by the anisotropic conductive adhesive 29.

Finally, the protective tape 30 is wound around the periphery of the joint part 13 fixed by the anisotropic conductive adhesive 29, and thereby the light-emitting device 10 is complete.

As shown in FIG. 4, FIG. 5, and the like, one end side of each of the first and second external wirings 24a and 24b formed on the flexible printed wiring board 21 is divided and constituted by the plurality of divided wirings 31 which are separated from each other. Therefore, connection between the first and second external wirings 24a and 24b of the flexible printed wiring board 21 and the first and second internal wiring ends 18c and 18d of the first light transmissive insulating substrate 16 is carried out by connecting the divided wirings 31 having a thin line width and the first and second internal wiring ends 18c and 18d having a thick line width via the anisotropic conductive adhesive 29. In other words, as shown in FIG. 9B, this connection is carried out by pressing the flexible printed wiring board 21 onto the first light transmissive insulating substrate 16 including the first and second internal wiring ends 18c and 18d so as to sandwich the anisotropic conductive adhesive 29 therebetween. Therein, the anisotropic conductive adhesive 29 is sandwiched between the thin line-shaped divided wirings 31 and the internal wiring ends 18c and 18d, and any excess anisotropic conductive adhesive 29 can escape to the spaces between the plurality of divided wirings 31. Thus, the anisotropic conductive adhesive 29 interposed between the thin line-shaped divided wirings 31 and the internal wiring ends 18c and 18d can be distributed with a uniform film thickness. As a result, the reliability of the electrical connection between the divided wirings 31 and the internal wiring ends 18c and 18d can be increased.

In contrast, in a case in which the ends of the first and second external wirings 24a and 24b formed on the flexible printed wiring board 21 are not divided and are instead constituted by wide wirings like those of the internal wiring ends 18c and 18d, when such a flexible printed wiring board 21 is pressed, the anisotropic conductive adhesive 29 interposed between the external wirings 24a and 24b and the internal wiring ends 18c and 18d does not have anywhere to escape, and thus partially concentrates between the wirings leading to a non-uniform distribution. As a result, the reliability of the electrical connection therebetween drops.

In this way, in the present embodiment, by constituting the ends of the first and second external wirings 24a and 24b with the plurality of thin line-shaped divided wirings 31, the reliability of the electrical connection with the first and second internal wiring ends 18c and 18d can be increased.

As explained above, according to the light-emitting device 10 of the present embodiment, since the external wiring part 12 including the connector 22 is provided at the end of the light-emitting part 11, the light-emitting device 10 can be easily connected to an external device, etc.

In addition, according to the light-emitting device 10 of the present embodiment, the external wiring part 12 is constituted mainly by the flexible printed wiring board 21 which has flexibility. In other words, since the light-emitting part 11 side of the first and second external wirings 24a and 24b of the flexible printed wiring board 21 is constituted by the plurality of thin line-shaped divided wirings 31, the first and second external wirings 24a and 24b are thereby imparted with flexibility. In this way, in the light-emitting device 10 of the present embodiment, since the external wiring part 12 constituted by the flexible printed wiring board 21 is provided at the end of the light-emitting part 11, the degree of freedom of attachment to an external device, etc. can be improved, and the light-emitting device 10 with superior versatility can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

Figure 10:
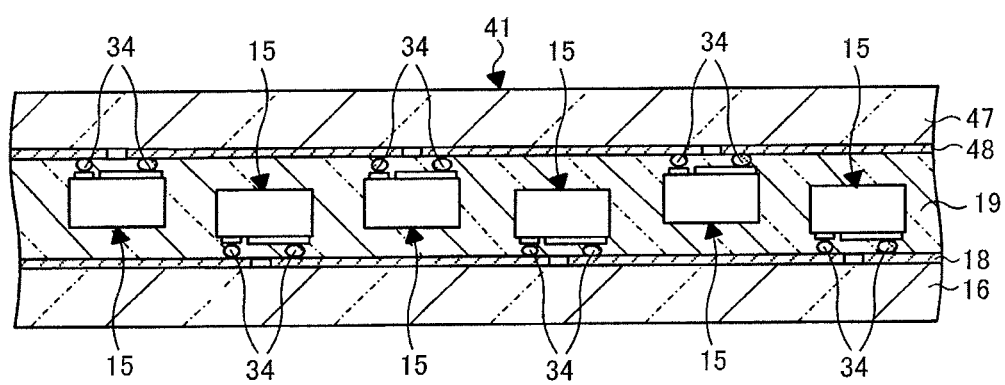
FIG. 10 is a cross-section view of the essential parts illustrating another embodiment.

For example, the constitution of the light-emitting part 11 is not limited to that described above. FIG. 10 is a cross-section view of the essential parts illustrating another embodiment of the light-emitting part of the light-emitting device. In FIG. 10, constituent portions which are identical or corresponding to those of the light-emitting device illustrated in FIG. 1A and FIG. 1B to FIG. 9A and FIG. 9B are illustrated with the same reference signs, and detailed explanations thereof are omitted.

As shown in FIG. 10, an internal wiring pattern 48 is formed on the surface of a second light transmissive insulating substrate 47. Among the plurality of LED elements 15 which have a one-side electrode structure, some of the LED elements 15 are connected via the metal bumps 34 to the internal wiring pattern 18 formed on the surface of the first light transmissive insulating substrate 16 similar to the light-emitting device 10 according to the above-described embodiment. However, the other LED elements 15 are connected via the metal bumps 34 to the internal wiring pattern 48 formed on the surface of the second light transmissive insulating substrate 47.

In a light-emitting part 41 of this structure, among the plurality of LED elements 15, the LED elements 15 which are connected to the internal wiring pattern 18 formed on the surface of the first light transmissive insulating substrate 16 are connected to each other serially, and the LED elements 15 which are connected to the internal wiring pattern 48 formed on the surface of the second light transmissive insulating substrate 47 are connected to each other serially.

Figure 11:
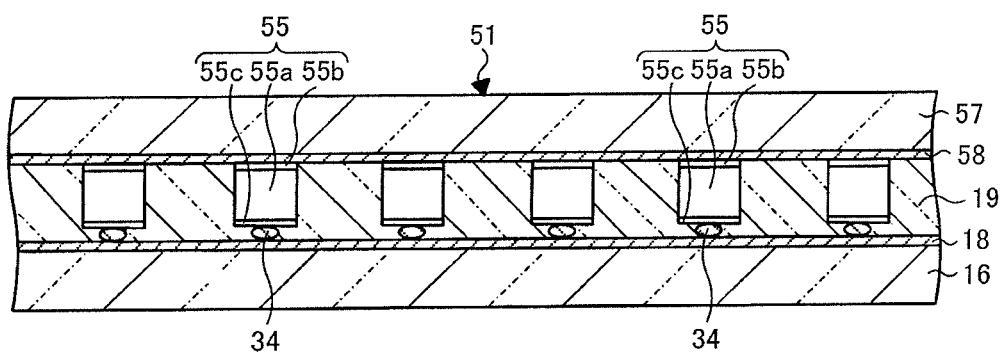
FIG. 11 is a cross-section view of the essential parts illustrating another embodiment.

Further, FIG. 11 is a cross-section view of the essential parts illustrating a further embodiment of the light-emitting part of the light-emitting device. In FIG. 11, constituent portions which are identical or corresponding to those of the light-emitting device illustrated in FIG. 1A and FIG. 1B to FIG. 9A and FIG. 9B are illustrated with the same reference signs, and detailed explanations thereof are omitted.

As shown in FIG. 11, an internal wiring pattern 58 is formed on the surface of a second light transmissive insulating substrate 57. A plurality of LED elements 55 disposed between the first light transmissive insulating substrate 16 and the second light transmissive insulating substrate 57 are each an LED element having a two-side electrode structure in which a first electrode 55b is formed on a top surface which is a light-emitting surface of an LED element body 55a and a second electrode 55c is formed on the bottom surface which is a non-light-emitting surface of the LED element body 55a. In this case, in each LED element 55, the first electrode 55b is directly connected to the internal wiring pattern 58 on the surface of the second light transmissive insulating substrate 57, and the second electrode 55c is connected via the metal bump 34 to the internal wiring pattern 18 on the surface of the first light transmissive insulating substrate 16.

In a light-emitting part 51 of this structure, the plurality of LED elements 55 are connected in parallel between the internal wiring pattern 18 on the surface of the first light transmissive insulating substrate 16 and the internal wiring pattern 58 of the second light transmissive insulating substrate 57.

In this way, the internal wiring pattern formed in the light-emitting part can have various circuit constitutions.

What is claimed is:

1. A light emitting device comprising:
   a light emitting part having flexibility;
   an external wiring part having higher flexibility than the light emitting part; and
   a joint part,
   wherein
   the light emitting part comprising:
   a first insulating substrate made of at least one resin selected from a group consisting of polyethylene terephthalate (PET), polyethylene naphthalate (PEN), polycarbonate (PC), polyethylene succinate (PES), cyclic olefin resin, and acrylic resin, and having flexibility due to a thickness of 300 μm or less,
   a light emitting part wiring pattern provided on the first insulating substrate the light emitting part wiring pattern provided so as to be routed on the first insulating substrate and the light emitting part wiring pattern has a light emitting part wiring pattern start point and a light emitting part wiring pattern end point at an end portion of the first insulating substrate;
   a plurality of light emitting elements connected to the wiring pattern; and
   a resin layer having optical transparency and supporting the plurality of light emitting elements with respect to the first insulating substrate,
   the external wiring part comprising:
   a flexible substrate;
   an external wiring pattern provided on a surface of the flexible substrate and having an external wiring pattern end portion divided into a plurality of divided wirings;
   the joint part comprising an anisotropic conductive adhesive that includes a conductive material and an adhesive and the anisotropic conductive adhesive mechanically and electrically connects the light emitting part wiring pattern end point and the external wiring pattern end portion.

2. The light emitting device according to claim 1, wherein a protective tape is wound around the joint part.

3. The light emitting device according to claim 2, wherein the light emitting part includes a second insulating substrate that is disposed to face the first insulating substrate via the plurality of light emitting elements and is made of a material equivalent to a material of the first insulating substrate, the external wiring part includes an insulating film laminated on the flexible substrate and covering the external wiring pattern, and the protective tape is provided from the first insulating substrate to the insulating film, and is provided from the second insulating substrate to the flexible substrate.

4. The light emitting device according to claim 3, wherein a space surrounded by the protective tape is formed between the light emitting part and the external wiring part.

5. The light emitting device according to claim 1, wherein an outer periphery of the joint part is covered with a resin.

6. The light emitting device according to claim 1, wherein the external wiring pattern end portion is divided into a plurality of divided wires having a line width narrower than a line width of the external wiring part, and each of the plurality of divided wires is connected to the light emitting part wiring pattern by the anisotropic conductive adhesive.

7. The light emitting device according to claim 6, wherein the external wiring pattern end portion is divided into three or more divided wires.

8. A display device for mobile, comprising:

a transparent substrate including, a conductive layer;

a light-emitting element supported by the transparent substrate and electrically connected to the conductive layer;

a connection portion electrically connected to the conductive layer at an end of the transparent substrate; and a connector electrically connected to the connection portion, wherein the conductive layer is routed on the transparent substrate and the conductive layer has a start point and an end point at an end portion of the transparent substrate;

the connection portion includes a wiring pattern having a connection portion wiring pattern first end divided into a plurality of divided wirings, and the connection portion wiring pattern first end is connected to the start point and the end point of the conductive layer.

* * * * *